United States Patent
Ji et al.

(10) Patent No.: US 9,754,531 B2
(45) Date of Patent: Sep. 5, 2017

(54) SHIFT REGISTER UNIT AND METHOD FOR DRIVING THE SAME, SHIFT REGISTER AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fengli Ji, Beijing (CN); Minghua Xuan, Beijing (CN); Taegyu Kim, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 166 days.

(21) Appl. No.: 14/779,778

(22) PCT Filed: Apr. 15, 2015

(86) PCT No.: PCT/CN2015/076635
§ 371 (c)(1),
(2) Date: Sep. 24, 2015

(87) PCT Pub. No.: WO2016/078304
PCT Pub. Date: May 26, 2016

(65) Prior Publication Data
US 2016/0329015 A1    Nov. 10, 2016

(30) Foreign Application Priority Data

Nov. 20, 2014 (CN) .......................... 2014 1 0669868

(51) Int. Cl.
*G11C 19/00* (2006.01)
*G09G 3/3225* (2016.01)
(Continued)

(52) U.S. Cl.
CPC ............. *G09G 3/3225* (2013.01); *G09G 3/32* (2013.01); *G11B 19/28* (2013.01); *G11C 19/184* (2013.01);
(Continued)

(58) Field of Classification Search
None
See application file for complete search history.

(56) References Cited

U.S. PATENT DOCUMENTS

2013/0170606 A1* 7/2013 Matsui ................... G11C 19/28
377/64
2013/0222352 A1* 8/2013 Jeong ................... G09G 3/3266
345/205
(Continued)

FOREIGN PATENT DOCUMENTS

CN    103426414 A    12/2013
CN    103489484 A    1/2014
(Continued)

OTHER PUBLICATIONS

International Search Report dated Jul. 28, 2015 issued in corresponding International Application No. PCT/CN2015/076635 along with an English translation of the Written Opinion of the International Searching Authority.

*Primary Examiner* — Tuan T Lam
(74) *Attorney, Agent, or Firm* — Nath, Goldberg & Meyer; Joshua B. Goldberg

(57) ABSTRACT

The present invention relates to display technology field, provides a shift register unit and a method for driving the same, a shift register, and a display apparatus for solving a
(Continued)

problem that the shift register unit of prior art cannot output a stable signal. The shift register unit of the present invention comprises an input module, a pull-up module, an output control module and an output pull-down module; the input module is connected with a signal input terminal, a first clock signal input terminal and a low level signal terminal; the output control module is connected with a second clock signal input terminal and a high level signal terminal; the pull-up module is connected with the high level signal terminal; the output pull-down module is connected with the first clock signal input terminal, the second clock signal input terminal, the high level signal terminal and the low level signal terminal.

20 Claims, 3 Drawing Sheets

(51) Int. Cl.
G09G 3/32 (2016.01)
G11B 19/28 (2006.01)
G11C 19/28 (2006.01)
G11C 19/18 (2006.01)

(52) U.S. Cl.
CPC ..... *G11C 19/28* (2013.01); *G09G 2300/0426* (2013.01); *G09G 2310/0286* (2013.01); *G09G 2310/08* (2013.01); *G09G 2320/0233* (2013.01); *G09G 2320/0242* (2013.01)

(56) References Cited

U.S. PATENT DOCUMENTS

| | | | |
|---|---|---|---|
| 2013/0266113 A1* | 10/2013 | Tsuge | H03K 3/00 377/64 |
| 2013/0321372 A1 | 12/2013 | Hung et al. | |
| 2015/0061982 A1* | 3/2015 | Woo | G09G 3/3266 345/82 |
| 2015/0255031 A1* | 9/2015 | Cao | G09G 3/3648 345/210 |
| 2016/0189648 A1* | 6/2016 | Xiao | G09G 3/3677 345/212 |
| 2016/0329015 A1* | 11/2016 | Ji | G09G 3/32 |
| 2016/0372041 A1* | 12/2016 | Sun | G09G 3/3258 |
| 2016/0372042 A1* | 12/2016 | Ma | G09G 3/3258 |

FOREIGN PATENT DOCUMENTS

| | | |
|---|---|---|
| CN | 104318904 A | 1/2015 |
| CN | 204178681 U | 2/2015 |
| KR | 2001-0045445 A | 6/2001 |
| KR | 10-2005-0114850 A | 12/2005 |

* cited by examiner

SHIFT REGISTER UNIT AND METHOD FOR DRIVING THE SAME, SHIFT REGISTER AND DISPLAY APPARATUS

This is a National Phase Application filed under 35 U.S.C. 371 as a national stage of PCT/CN2015/076635, filed Apr. 15, 2015, an application claiming the benefit of Chinese Application No. 201410669868.0, filed Nov. 20, 2014, the content of each of which is hereby incorporated by reference in its entirety.

FIELD OF THE INVENTION

The present invention relates to the field of display technology, and in particular, relates to a shift register unit and a method for driving the same, a shift register, and a display apparatus.

BACKGROUND OF THE INVENTION

Currently, active matrix organic light emitting diode (AMOLED) has got a rapid development, and a technology of gate driver on array (GOA) also has got a lot of progress.

Due to self-luminous characteristic of AMOLED, two kinds of GOAs are needed. One kind of GOA is a Gate GOA, which controls on/off of gate lines respectively connected with each row of pixels. The other kind of GOA is an Emission GOA which controls light emitting of each row of pixels. Emission GOA is an indispensable circuit in an AMOLED display product, and when one row of pixels are turned on, a low level is outputted by the Emission GOA to control light emitting of the row of pixels. However, the inventor finds that, the Emission GOA in the prior art cannot output a stable low level, thus light emission of the pixels is unstable, and due to influence of clock signals, dithering phenomenon may occur in the output low level, resulting in descending of display quality.

SUMMARY OF THE INVENTION

In view of above defects existing in the shift register of the prior art, an object of the present invention is to provide a shift register unit, a method for driving the same, a shift register and a display apparatus, which can output a stable signal.

One technical solution of the present invention is a shift register unit comprising an input module, a pull-up module, an output control module and an output pull-down module, wherein:

the input module is connected with a signal input terminal, a first clock signal input terminal and a low level signal terminal, and is configured to provide a signal inputted from the signal input terminal to a first node under the control of a signal inputted from the first clock signal input terminal, and control potential of a second node under the control of the signal inputted from the first clock signal input terminal and a low level signal inputted from the low level signal terminal;

the output control module is connected with a second clock signal input terminal and a high level signal terminal, and is configured to control potential of a third node under the control of a potential of the first node and the potential of the second node, a signal inputted from the second clock signal input terminal and a high level signal inputted from the high level signal terminal;

the pull-up module is connected with the high level signal terminal, and is configured to pull up a level of a signal output terminal to be a high level under the control of the potential of the third node;

the output pull-down module is connected with the first clock signal input terminal, the second clock signal input terminal, the high level signal terminal and the low level signal terminal, and is configured to pull down potential of the signal output terminal under the control of potential of the third node, the signal inputted from the first clock signal input terminal, the signal inputted from the second clock signal input terminal, the high level signal inputted from the high level signal terminal and the low level signal inputted from the low level signal terminal Preferably, the input module comprises a first input unit and a second input unit, wherein: the first input unit is connected with the signal input terminal and the first clock signal input terminal, and is configured to control the potential of the first node under the control of the signal inputted from the first clock signal input terminal;

the second input unit is connected with the first node, the first clock signal input terminal and the low level signal terminal, and is configured to control potential of the second node under the control of the potential of the first node and the signal inputted from the first clock signal input terminal Further preferably, the first input unit comprises a first transistor, and the second input unit comprises a second transistor and a third transistor, a first electrode of the first transistor is connected with the signal input terminal, a second electrode of the first transistor is connected with a control electrode of the second transistor and the first node, and a control electrode of the first transistor is connected with the first clock signal input terminal;

a first electrode of the second transistor is connected with the first clock signal input terminal, and a second electrode of the second transistor is connected with a second electrode of the third transistor and the second node;

a first electrode of the third transistor is connected with the low level signal terminal, and a control electrode of the third transistor is connected with the first clock signal input terminal.

Preferably, the output control module comprises a first output control unit, a second output control unit and a third output control unit, wherein the first output control unit is connected between the first node and the second node, and is connected with the second clock signal input terminal and the high level signal terminal, and is configured to pull up the potential of the first node under the control of the potential of the second node and the signal inputted from the second clock signal input terminal;

the second output control unit is connected with the first node, the second clock signal input terminal and the third node, and is configured to control the potential of the third node under the control of the potential of the first node and the signal inputted from the second clock signal input terminal;

the third output control unit is connected with the second node, the high level signal terminal and the third node, and is configured to output the high level signal inputted from the high level signal terminal to the third node under the control of the potential of the second node.

Further preferably, the first output control unit comprises a sixth transistor and a seventh transistor, the second output control unit comprises a fifth transistor and a first capacitor, and the third output control unit comprises a fourth transistor and a second capacitor;

a first electrode of the sixth transistor is connected with the high level signal terminal, a second electrode of the sixth transistor is connected with a first electrode of the seventh transistor, and a control electrode of the sixth transistor is connected with the second electrode of the third transistor and the second node;

a second electrode of the seventh transistor is connected with the second electrode of the first transistor and the first node, and a control electrode of the seventh transistor is connected with the second clock signal input terminal;

a first electrode of the fifth transistor is connected with the second clock signal input terminal, a second electrode of the fifth transistor is connected with the third node, and a control electrode of the fifth transistor is connected with the second electrode of the first transistor;

a first terminal of the first capacitor is connected with the second electrode of the first transistor and the second electrode of the seventh transistor, and a second terminal of the first capacitor is connected with a fourth node and the second electrode of the fifth transistor;

a first electrode of the fourth transistor is connected with the high level signal terminal, a second electrode of the fourth transistor is connected with the second electrode of the fifth transistor, and a control electrode of the fourth transistor is connected with the second electrode of the third transistor;

a first terminal of the second capacitor is connected with the second electrode of the second transistor and the second node, and a second terminal of the second capacitor is connected with the first electrode of the fourth transistor and the high level signal terminal.

Preferably, the output pull-down module comprises a first output pull-down unit and a second output pull-down unit, the first output pull-down unit is connected with the second clock signal input terminal, and is configured to pull down the potential of the signal output terminal under the control of the signal inputted from the second clock signal input terminal;

the second output pull-down unit is connected with the high level signal terminal, the third node, the first clock signal input terminal and the low level signal terminal, and is configured to pull down the potential of the signal output terminal to be the potential of the low level signal terminal under the control of the potential of the third node and the signal inputted from the first clock signal input terminal.

Further preferably, the first output pull-down unit comprises a third capacitor and a fourth capacitor, and the second output pull-down unit comprises an eighth transistor, a ninth transistor and an eleventh transistor, wherein:

a first electrode of the eighth transistor is connected with the high level signal terminal, a second electrode of the eighth transistor is connected with a first electrode of the ninth transistor and the fourth node, and a control electrode of the eighth transistor is connected with the third node;

a second electrode of the ninth transistor is connected with the low level signal terminal, and a control electrode of the ninth transistor is connected with the first clock signal input terminal;

a first electrode of the eleventh transistor is connected with the signal output terminal, a second electrode of the eleventh transistor is connected with the low level signal terminal, and a control electrode of the eleventh transistor is connected with the fourth node;

a first terminal of the third capacitor is connected with the second clock signal input terminal, and a second terminal of the third capacitor is connected with the fourth node;

a first terminal of the fourth capacitor is connected with the fourth node, and a second terminal of the fourth capacitor is connected with the signal output terminal.

Preferably, the pull-up module comprises a tenth transistor, wherein a first electrode of the tenth transistor is connected with the high level signal terminal, a second electrode of the tenth transistor is connected with the signal output terminal, and a control electrode of the tenth transistor is connected with the third node.

One technical solution of the present invention is a shift register comprising the above shift register unit.

One technical solution of the present invention is a display apparatus comprising the above shift register.

One technical solution of the present invention is a method for driving the shift register unit, in a first period, inputting a low level signal to the signal input terminal, inputting a low level signal to the first clock signal input terminal and inputting a high level signal to the second clock signal input terminal, pulling down potentials of the first node and the second node to be a low level by the input module, pulling up potential of the third node to be a high level by the output control module, pulling down potential of the fourth node to be a low level by the output pull-down module, and outputting a low level signal from the signal output terminal;

in a second period, inputting a high level signal to the signal input terminal, inputting a high level signal to the first clock signal input terminal and inputting a low level signal to the second clock signal input terminal, maintaining potential of the first node to be a low level under the control of the output control module, pulling down potential of the third node to be a low level, pulling up the potential of the second node to be a high level by the input module, outputting a high level signal to the signal output terminal by the pull-up module, maintaining potential of the signal output terminal to be a high level by the output pull-down module;

in a third period, inputting a high level signal to the signal input terminal, inputting a low level signal to the first clock signal input terminal and inputting a high level signal to the second clock signal input terminal, pulling up the potential of the first node to be a high level and pulling down the potential of the second node to be a low level by the input module, and pulling up the potential of the third node to be a high level under the control of the output control module, and controlling the potential of the fourth node to be a high level by the output pull-down module, so that a potential at the signal output terminal is lower than that in the second period since the fourth node discharges;

in a fourth period, inputting a high level signal to the signal input terminal, inputting a high level signal to the first clock signal input terminal and inputting a low level signal to the second clock signal input terminal, maintaining the potential of the first node to be a high level and the potential of the second node to at a low level by the output control module, outputting a high level signal from the third node under the control of the potential of the second node, pulling down the potential of the fourth node to be a low level by the output pull-down module, and outputting a low level signal from the signal output terminal;

in a fifth period, inputting a high level signal to the signal input terminal, inputting a low level signal to the first clock signal input terminal and inputting a high level signal to the second clock signal input terminal, maintaining the potential of the first node to be a high level and the potential of the second node to be a low level by the input module, outputting a high level signal from the third node under the control of the potential of the second node, pulling down the potential of the fourth node to be a low level by the output pull-down module, and outputting a low level signal from the signal output terminal Preferably, the input module comprises a first input unit and a second input unit; the output control module comprises a first output control unit, a second output control unit and a third output control unit; the output pull-down module comprises a first output pull-down unit and a second output pull-down unit; the method comprises:

in the first period, inputting the low level signal to the signal input terminal, inputting the low level signal to the first clock signal input terminal and inputting the high level signal to the second clock signal input terminal, pulling down the potential of the first node to be a low level by the first input unit, pulling down the potential of the second node to be a low level by the second input unit, pulling up the potential of the third node to be a high level by the second and third output control units, pulling down the potential of the fourth node to be a low level by the second output pull-down unit, and outputting the low level signal from the signal output terminal;

in the second period, inputting the high level signal to the signal input terminal, inputting the high level signal to the first clock signal input terminal and inputting the low level signal to the second clock signal input terminal, maintaining the potential of the first node to be a low level under the control of the first output control unit, pulling up the potential of the second node to be a high level by the second input unit, pulling up the potential of the third node to be a high level by the second output control unit, outputting the high level signal to the signal output terminal by the pull-up module, maintaining the potential of the signal output terminal to be a high level by the first output pull-down unit;

in the third period, inputting the high level signal to the signal input terminal, inputting the low level signal to the first clock signal input terminal and inputting the high level signal to the second clock signal input terminal, pulling up the potential of the first node to be a high level by the first input unit, pulling down the potential of the second node to be a low level by the second input unit, pulling up the potential of the third node to be a high level under the control of the third output control unit, pulling up the potential of the fourth node to be a high level under the control of the first output pull-down unit, so that the potential at the signal output terminal is lower than that in the second period since the fourth node discharges;

in the fourth period, inputting the high level signal to the signal input terminal, inputting the high level signal to the first clock signal input terminal and inputting the low level signal to the second clock signal input terminal, maintaining the potential of the second node to be a low level by the third output control unit, pulling up the potential of the first node to be a high level by the first output control unit, outputting the high level single at the third node under the control of the potential of the second node, pulling down the potential of the fourth node to be a low level by the first output pull-down unit, and outputting the low level signal from the signal output terminal;

in the fifth period, inputting the high level signal to the signal input terminal, inputting the low level signal to the first clock signal input terminal and inputting the high level signal to the second clock signal input terminal, maintaining the potential of the first node to be a high level by the first input unit, maintaining the potential of the second node to be a low level by the second input unit, outputting the high level signal from the third node under the control of the potential of the second node, maintaining potential of the fourth node to be a low level by the second output pull-down unit, and outputting the low level signal from the signal output terminal.

DETAILED DESCRIPTION OF THE EMBODIMENTS

In order to make a person skilled in the art better understand the technical solutions of the present invention, the present invention will be described in detail below in conjunction with the accompanying drawings and specific implementations.

Transistors employed in the embodiment of the present invention may be thin film transistors, field effect transistors, or other devices with the same characteristics. Since source and drain of the adopted transistor are symmetric, there is no difference between the source and the drain. In the embodiment of the present invention, in order to distinguish the source and the drain of the transistor from each other, one is referred as the first electrode, and the other is referred as the second electrode, the gate of the transistor is referred as the control electrode. In addition, transistors may be divided into N type and P type in accordance with characteristics thereof, the following embodiment is described by taking P type transistors as an example. When P type transistors are employed, the first electrode is the source of the P type transistor, the second electrode is the drain of the P type transistor. Those skilled in the art should know that, the present invention may be implemented by using N type transistors, which will also fall into the scope of the present invention.

First Embodiment

Figure 1:
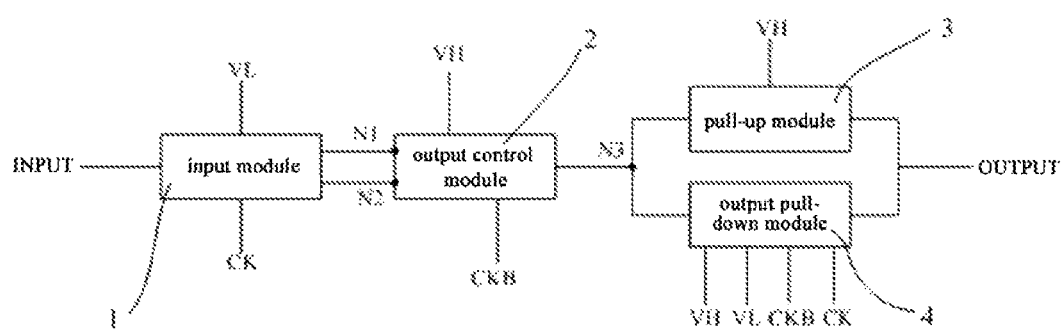
FIG. 1 is a diagram of a shift register unit in a first embodiment of the present invention.

The present embodiment provides a shift register unit, as shown in FIG. 1, comprising an input module 1, an output control module 2, a pull-up module 3 and an output pull-down module 4;

the input module 1 is connected with a signal input terminal INPUT, a first clock signal input terminal CK and a low level signal terminal VL for providing a signal inputted from the signal input terminal INPUT to a first node N1 under the control of a signal inputted from the first clock signal input terminal CK, and controlling potential of a second node N2 under the control of the signal inputted from the first clock signal input terminal CK and a signal inputted from the low level signal terminal VL;

the output control module 2 is connected with a second clock signal input terminal CKB and a high level signal terminal VH for controlling potential of a third node N3 under the control of the first node N1, the second node N2, a signal inputted from the second clock signal input terminal CKB and a high level signal inputted from the high level signal terminal VH;

the pull-up module 3 is connected with the high level signal terminal VH for pulling up a level of a signal output terminal OUTPUT to be a high level under the control of potential of the third node N3;

the output pull-down module 4 is connected with the first clock signal input terminal CK, the second clock signal input terminal CKB, the high level signal terminal VH and the low level signal terminal VL for pulling down potential of the signal output terminal OUTPUT under the control of potential of the third node N3, the signal inputted from the first clock signal input terminal CK, the signal inputted from the second clock signal input terminal CKB, the high level signal inputted from the high level signal terminal VH and the low level signal inputted from the low level signal terminal VL.

In the present embodiment, the output pull-down module 4 cooperates with the input module 1, the pull-up module 3 and the output control module 2 so that the signal output terminal OUTPUT of the shift register unit outputs a stable low level signal, resulting in an improved display quality; particularly, operation of the output pull-down module 4 in the present embodiment will not be affected by clock signals, which also ensures that the signal output terminal OUTPUT outputs the stable low level signal (details thereof will be described in conjunction with the method for driving the shift register as below).

Figure 2:
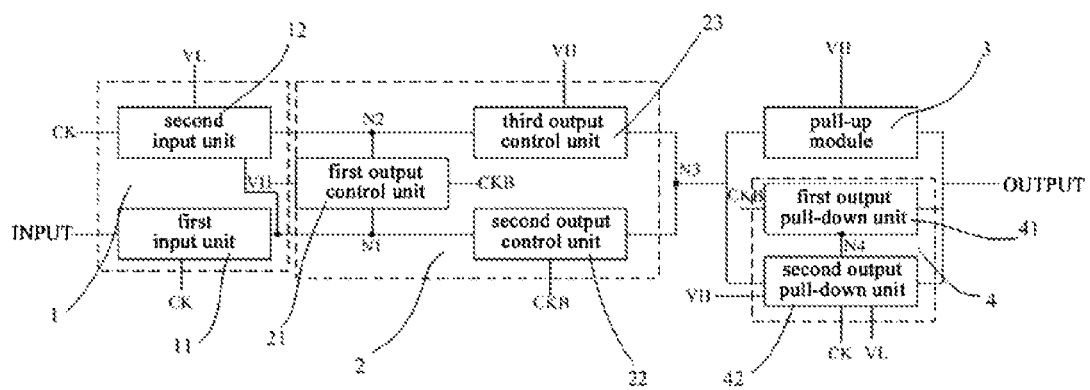
FIG. 2 is a diagram of a preferred mode of the shift register unit in the first embodiment of the present invention.

As shown in FIG. 2, preferably, the input module 1 comprises a first input unit 11 and a second input unit 12, wherein: the first input unit 11 is connected with the signal input terminal INPUT and the first clock signal input terminal CK for controlling potential of the first node N1 under the control of the signal inputted from the first clock signal input terminal CK; the second input unit 12 is connected with the first node N1, the first clock signal input terminal CK and the low level signal terminal VL for controlling potential of the second node N2 under the control of the first node N1 and the signal inputted from the first clock signal input terminal CK.

The output control module 2 comprises a first output control unit 21, a second output control unit 22 and a third output control unit 23, wherein the first output control unit 21 is connected between the first node N1 and the second node N2, and is connected with the second clock signal input terminal CKB and the high level signal terminal VH for pulling up potential of the first node N1 under the control of the second node N2 and the clock signal inputted from the second clock signal input terminal CKB; the second output control unit 22 is connected with the first node N1, the second clock signal input terminal CKB and the third node N3 for controlling potential of the third node N3 under the control of the potential of the first node N1 and the signal inputted from the second clock signal input terminal CKB; the third output control unit 23 is connected with the second node N2, the high level signal terminal VH and the third node N3 for outputting the high level signal inputted from the high level signal terminal VH to the third node N3 under the control of potential of the second node N2.

The output pull-down module 4 comprises a first output pull-down unit 41 and a second output pull-down unit 42, the first output pull-down unit 41 and the second output pull-down unit 42 are connected with each other through a fourth node N4, the first output pull-down unit 41 is connected with the second clock signal input terminal CKB for pulling down potential of the signal output terminal OUTPUT under the control of the signal inputted from the second clock signal input terminal CKB; the second output pull-down unit 42 is connected with the high level signal terminal VH, the third node N3, the first clock signal input terminal CK and the low level signal terminal VL for pulling down potential of the signal output terminal OUTPUT to be potential of the low level signal terminal VL under the control of the potential of the third node N3 and the signal inputted from the first clock signal input terminal CK.

As above, the shift register unit of the present embodiment has a simple structure which is easy to be realized.

Figure 4:
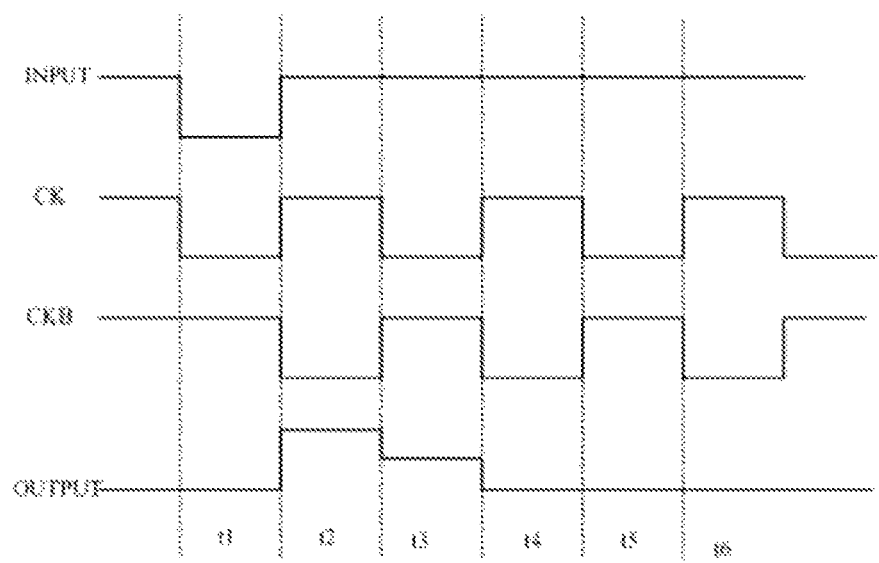
FIG. 4 is a timing diagram of operation of the shift register unit in the first embodiment of the present invention.

Correspondingly, the present embodiment provides a method for driving the above shift register unit, as shown in FIG. 4, comprising:

in a first period t1, a low level signal is inputted from the signal input terminal INPUT, a low level signal is inputted from the first clock signal input terminal CK, a high level signal is inputted from the second clock signal input terminal CKB, the input module 1 pulls down potentials of the first node N1 and the second node N2 to be a low level, the output control module 2 controls so as to pull up potential of the third node N3 to be a high level, the output pull-down module 4 pulls down potential of the fourth node N4 to be a low level, and the signal output terminal OUTPUT outputs a low level signal.

In a second period t2, a high level signal is inputted from the signal input terminal INPUT, a high level signal is inputted from the first clock signal input terminal CK, a low level signal is inputted from the second clock signal input terminal CKB, the potential of the first node N1 is maintained to be the low level under the control of the output control module 2, the input terminal 1 pulls up the potential of the second node N2 to be a high level, the potential of the third node N3 is pulled down to be a low level, the pull-up module 3 outputs a high level signal to the signal output terminal OUTPUT, and the output pull-down module 4 maintains the potential of the signal output terminal OUTPUT to be a high level.

In a third period t3, a high level signal is inputted from the signal input terminal INPUT, a low level signal is inputted from the first clock signal input terminal CK, a high level signal is inputted from the second clock signal input terminal CKB, the input module 1 pulls up the potential of the first node N1 to be a high level, pulls down the potential of the second node N2 to be a low level, and the potential of the third node N3 is pulled up to be a high level under the control of the output control module 2, the potential of the fourth node N4 becomes a high level under the control of the output pull-down module 4, since the fourth node N4 discharges, and the signal output terminal OUTPUT outputs a potential lower than that in the second period t2.

In a fourth period t4, a high level signal is inputted from the signal input terminal INPUT, a high level signal is inputted from the first clock signal input terminal CK, a low level signal is inputted from the second clock signal input terminal CKB, the output control module 2 maintains the potential of the first node N1 to be the high level and the potential of the second node N2 to be the low level, the third node N3 outputs a high level under the control of the potential of the second node N2, the output pull-down module 4 pulls down the potential of the fourth node N4 to be a low level, and the signal output terminal OUTPUT outputs a low level signal.

In a fifth period t5, a high level signal is inputted from the signal input terminal INPUT, a low level signal is inputted from the first clock signal input terminal CK, a high level signal is inputted from the second clock signal input terminal CKB, the input module 1 maintains the potential of the first node N1 to be the high level, and maintains the potential of the second node N2 to be the low level, the potential of the third node N3 is maintained to be the high level under the control of the potential of the second node N2, the output pull-down module 4 maintains the potential of the fourth node N4 to be the low level, and the signal output terminal OUTPUT outputs a low level signal.

Operations of the shift register unit in a sixth period t6 are the same as those in the fourth period t4, the signal output terminal OUTPUT maintains to output the low level signal, until the signal input terminal inputs a low level signal in the next frame so that the shift register unit restarts operations.

In this method for driving the shift register unit, the output pull-down module 4 cooperates with the input module 1, the pull-up module 3 and the output control module 2 so that the signal output terminal OUTPUT of the shift register unit outputs a stable low level signal, resulting in an improved display quality; particularly, the operation of the output pull-down module 4 in the present embodiment will not be affected by clock signals, which also ensures that the signal output terminal OUTPUT outputs the stable low level signal.

When the input module 1 in the shift register unit comprises the first input unit 11 and the second input unit 12; the output control module 2 comprises the first output control unit 21, the second output control unit 22 and the third output control unit 23; and the output pull-down module 4 comprises the first output pull-down unit 41 and the second output pull-down unit 42, the method for driving the shift register unit, as shown in FIG. 4, specifically comprises:

in the first period t1, the low level signal is inputted from the signal input terminal INPUT, the low level signal is inputted from the first clock signal input terminal CK and the high level signal is inputted from the second clock signal input terminal CKB, the first input unit 11 pulls down the potential of the first node N1 to be the low level, the second input unit 12 pulls down the potential of the second node N2 to be the low level, the second and third output control units pull up the potential of the third node N3 to be the high level, the second output pull-down unit pulls down the potential of the fourth node N4 to be the low level, and the signal output terminal OUTPUT outputs the low level signal.

In the second period t2, the high level signal is inputted from the signal input terminal INPUT, the high level signal is inputted from the first clock signal input terminal CK, the low level signal is inputted from the second clock signal input terminal CKB, the potential of the first node N1 is maintained to be the low level under the control of the first output control unit 21, the second input unit 12 pulls up the potential of the second node N2 to be the high level, the second output control unit 22 pulls up the potential of the third node N3 to be the high level, the pull-up module 3 outputs the high level signal to the signal output terminal OUTPUT, and the first output pull-down unit 41 maintains the potential of the signal output terminal OUTPUT to be the high level.

In the third period t3, the high level signal is inputted from the signal input terminal INPUT, the low level signal is inputted from the first clock signal input terminal CK, the high level signal is inputted from the second clock signal input terminal CKB, the first input unit 11 pulls up the potential of the first node N1 to be the high level, the second input unit 12 pulls down the potential of the second node N2 to be the low level, the potential of the third node N3 is maintained to be the high level under the control of the third output control unit 23, the potential of the fourth node N4 is pulled up to be the high level under the control of the first output pull-down unit 41, and the signal output terminal OUTPUT outputs the potential lower than that in the second period t2.

In the fourth period t4, the high level signal is inputted from the signal input terminal INPUT, the high level signal is inputted from the first clock signal input terminal CK, the low level signal is inputted from the second clock signal input terminal CKB, the third output control unit maintains the potential of the second node N2 to be the low level, the potential of the first node N1 is pulled up to be the high level by the first output control unit 21, the third node N3 is maintained to be the high level under the control of potential of the second node N2, the first output pull-down unit 41 pulls down the potential of the fourth node N4 to be the low level, and the signal output terminal OUTPUT outputs the low level signal.

In the fifth period t5, the high level signal is inputted from the signal input terminal INPUT, the low level signal is inputted from the first clock signal input terminal CK, the high level signal is inputted from the second clock signal input terminal CKB, the first input unit 11 maintains the potential of the first node N1 to be the high level, the second input unit 12 maintains the potential of the second node N2 to be the low level, the third node N3 is maintained to be the high level under the control of the potential of the second node N2, the second output pull-down unit 42 maintains the potential of the fourth node N4 to be the low level, and the signal output terminal OUTPUT outputs the low level signal.

Operations of the shift register unit in the sixth period t6 are the same as those in the fourth period t4, the signal output terminal OUTPUT maintains to output the low level signal, until the signal input terminal INPUT inputs a low level signal in the next frame so that the shift register unit restarts operations.

As above, the method for driving the shift register unit has a simple timing sequence and is easy to be controlled, thus is easy to be achieved.

Figure 3:
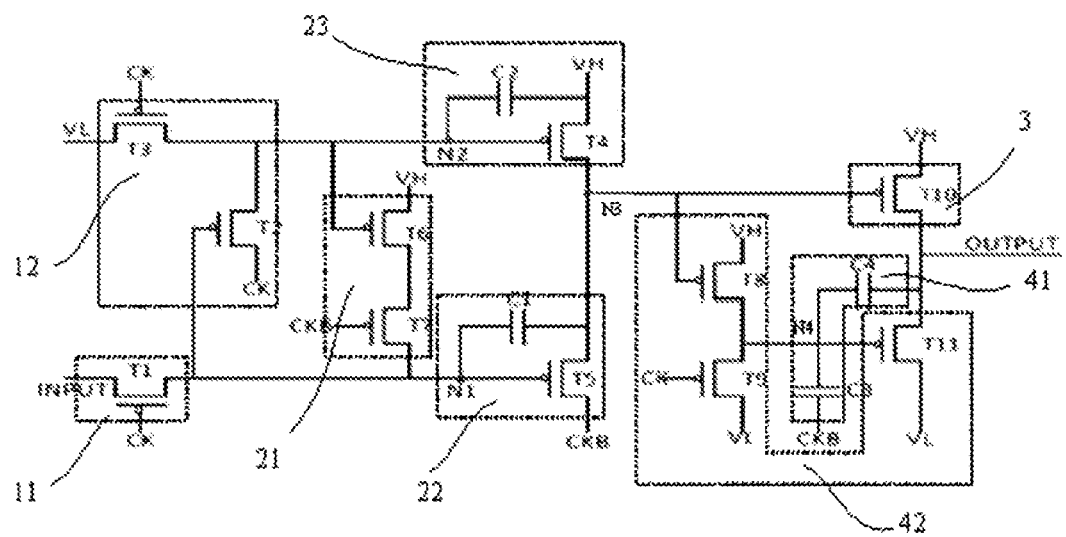
FIG. 3 is a principle diagram of the shift register unit in the first embodiment of the present invention.

As shown in FIG. 3, as a preferred mode of the present embodiment, the first input unit 11 comprises a first transistor T1, and the second input unit 12 comprises a second transistor T2 and a third transistor T3, wherein: a first electrode of the first transistor T1 is connected with the signal input terminal INPUT, a second electrode of the first transistor T1 is connected with a control electrode of the second transistor T2 and the first node N1, and a control electrode of the first transistor T1 is connected with the first clock signal input terminal CK; a first electrode of the second transistor T2 is connected with the first clock signal input terminal CK, and a second electrode of the second transistor T2 is connected with a second electrode of the third transistor T3 and the second node N2; a first electrode of the third transistor T3 is connected with the low level signal terminal VL, and a control electrode of the third transistor T3 is connected with the first clock signal input terminal CK. The first output control unit 21 comprises a sixth transistor T6 and a seventh transistor T7, the second output control unit 22 comprises a fifth transistor T5 and a first capacitor C1, and the third output control unit 23 comprises a fourth transistor T4 and a second capacitor C2; a first electrode of the sixth transistor T6 is connected with the high level signal terminal VH, a second electrode of the sixth transistor T6 is connected with a first electrode of the seventh transistor T7, and a control electrode of the sixth transistor T6 is connected with the second electrode of the third transistor T3 and the second node N2; a second electrode of the seventh transistor T7 is connected with the second electrode of the first transistor T1 and the first node N1, and a control electrode of the seventh transistor T7 is connected with the second clock signal input terminal CKB; a first electrode of the fifth transistor T5 is connected with the second clock signal input terminal CKB, a second electrode of the fifth transistor T5 is connected with the third node N3, and a control electrode of the fifth transistor T5 is connected with the second electrode of the first transistor T1; a first terminal of the first capacitor C1 is connected with the second electrode of the first transistor T1 and the second electrode of the seventh transistor T7, and a second terminal of the first capacitor C1 is connected with a fourth node N4 and the second electrode of the fifth transistor T5; a first electrode of the fourth transistor T4 is connected with the high level signal terminal VH, a second electrode of the fourth transistor T4 is connected with the second electrode of the fifth transistor T5, and a control electrode of the fourth transistor T4 is connected with the second electrode of the third transistor T3; a first terminal of the second capacitor C2 is connected with the second electrode of the second transistor T2 and the second node N2, and a second terminal of the second capacitor C2 is connected with the first electrode of the fourth transistor T4 and the high level signal terminal VH. The first output pull-down unit 41 comprises a third capacitor C3 and a fourth capacitor C4, and the second output pull-down unit 42 comprises an eighth transistor T8, a ninth transistor T9 and an eleventh transistor T11, wherein: a first electrode of the eighth transistor T8 is connected with the high level signal terminal VH, a second electrode of the eighth transistor T8 is connected with a first electrode of the ninth transistor T9 and the fourth node N4, and a control electrode of the eighth transistor T8 is connected with the third node N3; a second electrode of the ninth transistor T9 is connected with the low level signal terminal VL, and a control electrode of the ninth transistor T9 is connected with the first clock signal input terminal CK; a first electrode of the eleventh transistor T11 is connected with the signal output terminal OUTPUT, a second electrode of the eleventh transistor T11 is connected with the low level signal terminal VL, and a control electrode of eleventh transistor T11 is connected with the fourth node N4; a first terminal of the third capacitor C3 is connected with the second clock signal input terminal CKB, and a second terminal of the third capacitor C3 is connected with the fourth node N4; a first terminal of the fourth capacitor C4 is connected with the fourth node N4, and a second terminal of the fourth capacitor C4 is connected with the signal output terminal OUTPUT. The pull-up module 3 comprises a tenth transistor T10, wherein a first electrode of the tenth transistor T10 is connected with the high level signal terminal VH, a second electrode of the tenth transistor T10 is connected with the signal output terminal OUTPUT, and a control electrode of the tenth transistor T10 is connected with the third node N3.

The method for driving the shift register unit of the present embodiment will be described in conjunction with FIGS. 3 and 4.

In the first period t1, the low level signal is inputted from the signal input terminal INPUT, the low level signal is inputted from the first clock signal input terminal CK, the high level signal is inputted from the second clock signal input terminal CKB, the first transistor T1 is turned on, since the low level signal is inputted from the signal input terminal INPUT, the potential of the first node N1 connecting the second electrode of the first transistor T1 and the control electrode of the fifth transistor T5 is the low level, so that the second transistor T2 and the fifth transistor T5 are turned on, at this time, at this time, since the high level signal is inputted from the second clock signal input terminal CKB, the potential of the third node N3 connecting the second electrode of the fourth transistor T4 and the second electrode of the fifth transistor T5 is the high level, further since the low level signal is inputted from the first clock signal input terminal CK, the third transistor T3 is also turned on, the potential of the second node N2 connecting the second electrode of the third transistor T3, the control electrode of the fourth transistor T4 and the first terminal of the second capacitor C2 is the low level, the sixth transistor T6 is turned on; since the high level signal is inputted from the second clock signal input terminal CKB, the seventh transistor T7 is turned off, further since the second node N2 is at a low level, the fourth transistor T4 is turned on, and the third node N3 is at a high level, since the third node N3 is at a high level, the eighth transistor T8 and the tenth transistor T10 are turned off; since the first clock signal input terminal CK inputs the low level, the ninth transistor T9 is turned on, the potential of the fourth node N4 connecting the second electrode of the eighth transistor T8, the first electrode of the ninth transistor T9, the control electrode of the eleventh transistor T11, the second terminal of the third capacitor C3 and the first terminal of the fourth transistor T4 is the low level, thus the eleventh transistor T11 is turned on, further since the first electrode of the eleventh transistor T11 is connected with the low level signal, the signal output terminal OUTPUT outputs the low level.

In the second period t2, the high level signal is inputted from the signal input terminal INPUT, the low level signal is inputted from the second clock signal input terminal CKB, the high level signal is inputted from the first clock signal input terminal CK, at this time, the first transistor Ti and the third transistor T3 are turned off, due to the maintaining function of the first capacitor C1, at this time, the first node N1 is still at a low level, since the low level signal is inputted from the second clock signal input terminal CKB, due to the coupling function of the first capacitor C1, the potential of the first node N1 is lower at this time, thus the potential of the third node N3 is pulled down, and the second transistor T2 is turned on, since the high level signal is inputted from the first clock signal input terminal CK, the potential of the second node N2 is pulled up, so that the fourth transistor T4 is turned off, the third node N3 is maintained to be the low level inputted from the second clock signal input terminal CKB, the eighth transistor T8 and the tenth transistor T10 are turned on at this time, due to the coupling effect of the third capacitor C3, the potential of the fourth node N4 is pulled down instantaneously, but since the eighth transistor T8 is turned on, the potential of the fourth node N4 becomes high level immediately after being pulled down instantaneously, thus the eleventh transistor T11 is turned off, the tenth transistor T10 is turned on, and the signal output terminal OUTPUT outputs the high level.

In the third period t3, the high level signal is inputted from the signal input terminal INPUT, the high level signal is inputted from the second clock signal input terminal CKB and the low level signal is inputted from the first clock signal input terminal CK, the first transistor T1 is turned on, since the high level signal is inputted from the signal input terminal INPUT, the first node N1 is at a high level, so that the second transistor T2 and the fifth transistor T5 are turned off, since the low level signal is inputted from the first clock signal input terminal CK, the third transistor T3 is thus turned on, the second node N2 is at a low level, thereby the fourth transistor T4 is turned on, and the third node N3 is at a high level, since the third node N3 is at a high level, the eighth transistor T8 and the tenth transistor T10 are turned off, due to the coupling effect of the third capacitor C3 and the maintaining function of the fourth capacitor C4, the potential of the fourth node N4 becomes high level instantaneously and then is maintained to be the high level, so that the eleventh transistor T1 is turned off, the output is maintained to be the high level, but since the low level signal is inputted from the first clock signal input terminal CK, the ninth transistor T9 is turned on, due to the effects of the third capacitor C3 and the fourth capacitor C4, the fourth node N4 discharges, thereby although the output is the high level, the voltage thereof is lowered.

In the fourth period t4, the high level signal is inputted from the signal input terminal INPUT, the low level signal is inputted from the second clock signal input terminal CKB and the high level signal is inputted from the first clock signal input terminal CK, at this time, the first transistor Ti and the third transistor T3 are turned off, the first node N1 is at a high level, and the second transistor T2 and the fifth transistor T5 are turned off; due to the maintaining function of the second capacitor C2, the second node N2 is at a low level, the sixth transistor T6 is turned on, and since the low level signal is inputted from the second clock signal input terminal CKB, the seventh transistor T7 is turned on, thereby the first node N1 is maintained at a high level, the third node N3 is not affected by the signal inputted from the second clock signal input terminal CKB and is maintained to be the high level, meanwhile since the second node N2 is at a low level, the fourth transistor T4 is turned on, the third node N3 is still at a high level, the eighth transistor T8 and the tenth transistor T10 are turned off; since the high level signal is inputted from the first clock signal input terminal CK, the ninth transistor T9 is turned off, and since the low level signal is inputted from the second clock signal input terminal CKB, due to the coupling effect of the third capacitor C3, the potential of the fourth node N4 is pulled down to be the low level, when the high level signal is inputted from the first clock signal input terminal CK, the potential of the fourth node N4 is lowered by means of the third capacitor C3 receiving the signal inputted from the second clock signal input terminal CKB, so that the output of the signal output terminal OUTPUT is stable and is not affected by the signal inputted from the first clock signal input terminal CK, the eleventh transistor T11 is turned on, and the signal output terminal OUTPUT outputs a stable low level.

In the fifth period t5, the high level signal is inputted from the signal input terminal INPUT, the high level signal is inputted from the second clock signal input terminal CKB and the low level signal is inputted from the first clock signal input terminal CK, the first transistor T1 is turned on, since the high level signal is inputted from the signal input terminal INPUT, the first node N1 is at a high level, so that the second transistor T2 and the fifth transistor T5 are turned off, the third transistor T3 is turned on, and the second node N 2 is at a low level, thereby the fourth transistor T4 is turned on, the third node N3 is at a high level, and the eighth transistor T8 and the tenth transistor T10 are turned off, since the low level of the third node N3 at the last moment is maintained by the fourth capacitor C4, at this time, due to the coupling effect of the third capacitor C3, the potential of the fourth node N4 is pulled up instantaneously, but since the ninth transistor T9 is turned on, the fourth node N4 is reset to be the low level, thus the eleventh transistor T11 is turned on, and the signal output terminal OUTPUT outputs the low level.

It can be seen that, starting from the fourth period t4, no matter the signal inputted from the second clock signal input terminal CKB is the low level or the high level, due to the usage of the third capacitor C3 and the fourth capacitor C4, the output of the signal output terminal OUTPUT is not affected by the clock signals, and is a stable low level.

Starting from the sixth period t6, operations in the fourth period t4 and the fifth period t5 are repeated, which are not described repeatedly here.

It should be noted that, in the present embodiment, the shift register unit preferably comprises a fourth capacitor C4, of course, the fourth capacitor C4 may be not contained, which will not affect the whole operation state, details are omitted here.

Correspondingly, the present embodiment provides a shift register comprising a plurality of the above shift register units cascaded together, wherein the signal outputted from the signal output terminal OUTPUT of each shift register unit is used as the signal inputted into the signal input terminal INPUT of the next stage, the signal input terminal INPUT of the shift register unit of the first stage is connected with a frame strobe signal STV.

Figure 5:
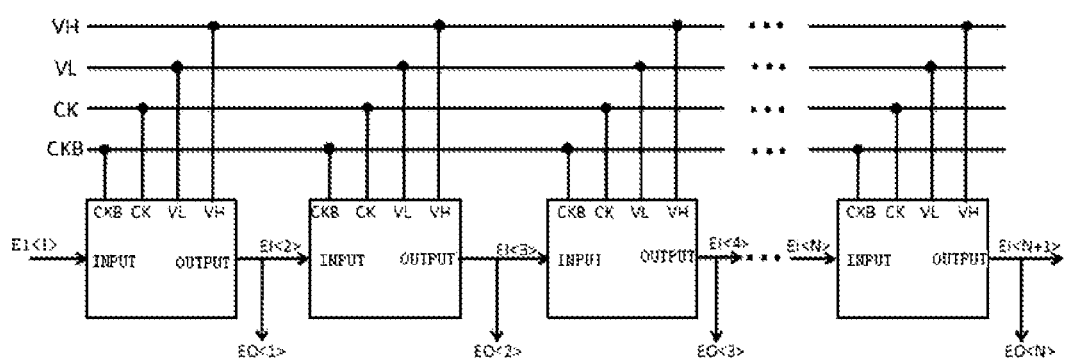
FIG. 5 is a diagram of a shift register in the first embodiment of the present invention.

As shown in FIG. 5, specifically, the first clock signal input terminal CK, the second clock signal input terminal CKB, the high level signal terminal VH, the low level signal terminal VL in each shift register unit are respectively connected with the signal lines corresponding thereto for introducing the corresponding signals respectively. Signals inputted the signal input terminals INPUTs of the shift register units are Ei<1>, Ei<2> . . . Ei<N+1> respectively, wherein Ei<1> is a STV signal, each signal output terminal OUTPUT is also used as input of the shift register unit of the next stage, for example, the signal outputted from the signal output terminal OUTPUT of the first shift register unit is the signal Ei<2> inputted into the signal input terminal INPUT of the second shift register unit. Moreover, the signal output terminals OUTPUTs are respectively connected with the pixel units (i.e., Eo<1>, Eo<2> . . . Eo<N>) corresponding thereto, so that the light emitting devices in the pixel units emit light.

Correspondingly, the present embodiment also provides a display apparatus comprising the above shift register. The display apparatus may be a phone, a tablet computer, a television, a monitor, a notebook computer, a digital photo frame, a navigator or any other product or component with display function.

Since the display apparatus of the present embodiment comprises the above shift register, it has better performance.

Of course, the display apparatus of the present embodiment may further comprise other conventional configurations such as a display driving unit and so on.

It should be understood that, the above implementations are merely exemplary implementations adopted for describing the principle of the present invention, rather than limiting the present invention. Various variations and improvements may be made for those of ordinary skill in the art without departing from the spirit and essence of the present invention, and these variations and improvements are regarded within the protection scope of the present invention.

The invention claimed is:

1. A shift register unit, comprising an input module, a pull-up module, an output control module and an output pull-down module, wherein:

the input module is connected with a signal input terminal, a first clock signal input terminal and a low level signal terminal, and is configured to provide a signal inputted from the signal input terminal to a first node under the control of a signal inputted from the first clock signal input terminal, and control potential of a second node under the control of the signal inputted from the first clock signal input terminal and a low level signal inputted from the low level signal terminal;

the output control module is connected with a second clock signal input terminal and a high level signal terminal, and is configured to control potential of a third node under the control of a potential of the first node, the potential of the second node, a signal inputted from the second clock signal input terminal and a high level signal inputted from the high level signal terminal;

the pull-up module is connected with the high level signal terminal, and is configured to pull up a level of a signal output terminal to be at a high level under the control of the potential of the third node; and the output pull-down module is connected with the first clock signal input terminal, the second clock signal input terminal, the high level signal terminal and the low level signal terminal, and is configured to pull down potential of the signal output terminal under the control of the potential of the third node, the signal inputted from the first clock signal input terminal, the signal inputted from the second clock signal input terminal, the high level signal inputted from the high level signal terminal and the low level signal inputted from the low level signal terminal.

2. The shift register unit of claim 1, wherein the input module comprises a first input unit and a second input unit, the first input unit is connected with the signal input terminal and the first clock signal input terminal, and is configured to control the potential of the first node under the control of the signal inputted from the first clock signal input terminal;

the second input unit is connected with the first node, the first clock signal input terminal and the low level signal terminal, and is configured to control the potential of the second node under the control of the potential of the first node and the signal inputted from the first clock signal input terminal.

3. The shift register unit of claim 2, wherein the first input unit comprises a first transistor, and the second input unit comprises a second transistor and a third transistor, a first electrode of the first transistor is connected with the signal input terminal, a second electrode of the first transistor is connected with a control electrode of the second transistor and the first node, and a control electrode of the first transistor is connected with the first clock signal input terminal;

a first electrode of the second transistor is connected with the first clock signal input terminal, and a second electrode of the second transistor is connected with a second electrode of the third transistor and the second node;

a first electrode of the third transistor is connected with the low level signal terminal, and a control electrode of the third transistor is connected with the first clock signal input terminal.

4. The shift register unit of claim 1, wherein the output control module comprises a first output control unit, a second output control unit and a third output control unit, the first output control unit is connected between the first node and the second node, and is connected with the second clock signal input terminal and the high level signal terminal, and is configured to pull up the potential of the first node under the control of the potential of the second node and a clock signal inputted from the second clock signal input terminal;

the second output control unit is connected with the first node, the second clock signal input terminal and the third node, and is configured to control the potential of the third node under the control of the potential of the first node and the signal inputted from the second clock signal input terminal;

the third output control unit is connected with the second node, the high level signal terminal and the third node, and is configured to output the high level signal inputted from the high level signal terminal to the third node under the control of the potential of the second node.

5. The shift register unit of claim 4, wherein the first output control unit comprises a sixth transistor and a seventh transistor, the second output control unit comprises a fifth transistor and a first capacitor, and the third output control unit comprises a fourth transistor and a second capacitor;

a first electrode of the sixth transistor is connected with the high level signal terminal, a second electrode of the sixth transistor is connected with a first electrode of the seventh transistor, and a control electrode of the sixth transistor is connected with the second electrode of the third transistor and the second node;

a second electrode of the seventh transistor is connected with the second electrode of the first transistor and the first node, and a control electrode of the seventh transistor is connected with the second clock signal input terminal;

a first electrode of the fifth transistor is connected with the second clock signal input terminal, a second electrode of the fifth transistor is connected with the third node, and a control electrode of the fifth transistor is connected with the second electrode of the first transistor;

a first terminal of the first capacitor is connected with the second electrode of the first transistor and the second electrode of the seventh transistor, and a second terminal of the first capacitor is connected with a fourth node and the second electrode of the fifth transistor;

a first electrode of the fourth transistor is connected with the high level signal terminal, a second electrode of the fourth transistor is connected with the second electrode of the fifth transistor, and a control electrode of the fourth transistor is connected with the second electrode of the third transistor;

a first terminal of the second capacitor is connected with the second electrode of the second transistor and the second node, and a second terminal of the second capacitor is connected with the first electrode of the fourth transistor and the high level signal terminal.

6. The shift register unit of claim 1, wherein the output pull-down module comprises a first output pull-down unit and a second output pull-down unit, the first output pull-down unit and the second output pull-down unit are connected with each other through the fourth node;

the first output pull-down unit is connected with the second clock signal input terminal, and is configured to pull down the potential of the signal output terminal under the control of the signal inputted from the second clock signal input terminal;

the second output pull-down unit is connected with the high level signal terminal, the third node, the first clock signal input terminal and the low level signal terminal, and is configured to pull down the potential of the signal output terminal to be the potential of the low level signal terminal under the control of the potential of the third node and the signal inputted from the first clock signal input terminal.

7. The shift register unit of claim 6, wherein the first output pull-down unit comprises a third capacitor and a fourth capacitor, and the second output pull-down unit comprises an eighth transistor, a ninth transistor and an eleventh transistor, wherein:
a first electrode of the eighth transistor is connected with the high level signal terminal, a second electrode of the eighth transistor is connected with a first electrode of the ninth transistor and the fourth node, and a control electrode of the eighth transistor is connected with the third node;
a second electrode of the ninth transistor is connected with the low level signal terminal, and a control electrode of the ninth transistor is connected with the first clock signal input terminal;
a first electrode of the eleventh transistor is connected with the signal output terminal, a second electrode of the eleventh transistor is connected with the low level signal terminal, and a control electrode of the eleventh transistor is connected with the fourth node;
a first terminal of the third capacitor is connected with the second clock signal input terminal, and a second terminal of the third capacitor is connected with the fourth node;
a first terminal of the fourth capacitor is connected with the fourth node, and a second terminal of the fourth capacitor is connected with the signal output terminal.

8. The shift register unit of claim 1, wherein the pull-up module comprises a tenth transistor,
a first electrode of the tenth transistor is connected with the high level signal terminal, a second electrode of the tenth transistor is connected with the signal output terminal, and a control electrode of the tenth transistor is connected with the third node.

9. A shift register, comprising a plurality of cascaded shift register units, each of which is the shift register unit according to claim 1.

10. The shift register of claim 9, wherein the input module comprises a first input unit and a second input unit,
the first input unit is connected with the signal input terminal and the first clock signal input terminal, and is configured to control the potential of the first node under the control of the signal inputted from the first clock signal input terminal;
the second input unit is connected with the first node, the first clock signal input terminal and the low level signal terminal, and is configured to control the potential of the second node under the control of the potential of the first node and the signal inputted from the first clock signal input terminal.

11. The shift register of claim 10, wherein the first input unit comprises a first transistor, and the second input unit comprises a second transistor and a third transistor,
a first electrode of the first transistor is connected with the signal input terminal, a second electrode of the first transistor is connected with a control electrode of the second transistor and the first node, and a control electrode of the first transistor is connected with the first clock signal input terminal;
a first electrode of the second transistor is connected with the first clock signal input terminal, and a second electrode of the second transistor is connected with a second electrode of the third transistor and the second node;
a first electrode of the third transistor is connected with the low level signal terminal, and a control electrode of the third transistor is connected with the first clock signal input terminal.

12. The shift register of claim 9, wherein the output control module comprises a first output control unit, a second output control unit and a third output control unit,
the first output control unit is connected between the first node and the second node, and is connected with the second clock signal input terminal and the high level signal terminal, and is configured to pull up the potential of the first node under the control of the potential of the second node and the signal inputted from the second clock signal input terminal;
the second output control unit is connected with the first node, the second clock signal input terminal and the third node, and is configured to control the potential of the third node under the control of the potential of the first node and the signal inputted from the second clock signal input terminal;
the third output control unit is connected with the second node, the high level signal terminal and the third node, and is configured to output the high level signal inputted from the high level signal terminal to the third node under the control of the potential of the second node.

13. The shift register of claim 12, wherein the first output control unit comprises a sixth transistor and a seventh transistor, the second output control unit comprises a fifth transistor and a first capacitor, and the third output control unit comprises a fourth transistor and a second capacitor;
a first electrode of the sixth transistor is connected with the high level signal terminal, a second electrode of the sixth transistor is connected with a first electrode of the seventh transistor, and a control electrode of the sixth transistor is connected with the second electrode of the third transistor and the second node;
a second electrode of the seventh transistor is connected with the second electrode of the first transistor and the first node, and a control electrode of the seventh transistor is connected with the second clock signal input terminal;
a first electrode of the fifth transistor is connected with the second clock signal input terminal, a second electrode of the fifth transistor is connected with the third node, and a control electrode of the fifth transistor is connected with the second electrode of the first transistor;
a first terminal of the first capacitor is connected with the second electrode of the first transistor and the second electrode of the seventh transistor, and a second terminal of the first capacitor is connected with a fourth node and the second electrode of the fifth transistor;
a first electrode of the fourth transistor is connected with the high level signal terminal, a second electrode of the fourth transistor is connected with the second electrode of the fifth transistor, and a control electrode of the fourth transistor is connected with the second electrode of the third transistor;
a first terminal of the second capacitor is connected with the second electrode of the second transistor and the second node, and a second terminal of the second capacitor is connected with the first electrode of the fourth transistor and the high level signal terminal.

14. The shift register of claim 9, wherein the output pull-down module comprises a first output pull-down unit and a second output pull-down unit, the first output pull-down unit and the second output pull-down unit are connected with each other through the fourth node;
the first output pull-down unit is connected with the second clock signal input terminal, and is configured to pull down the potential of the signal output terminal under the control of the signal inputted from the second clock signal input terminal;

the second output pull-down unit is connected with the high level signal terminal, the third node, the first clock signal input terminal and the low level signal terminal, and is configured to pull down the potential of the signal output terminal to be the potential of the low level signal terminal under the control of the potential of the third node and the signal inputted from the first clock signal input terminal.

15. The shift register of claim 14, wherein the first output pull-down unit comprises a third capacitor and a fourth capacitor, and the second output pull-down unit comprises an eighth transistor, a ninth transistor and an eleventh transistor, wherein:

a first electrode of the eighth transistor is connected with the high level signal terminal, a second electrode of the eighth transistor is connected with a first electrode of the ninth transistor and the fourth node, and a control electrode of the eighth transistor is connected with the third node;

a second electrode of the ninth transistor is connected with the low level signal terminal, and a control electrode of the ninth transistor is connected with the first clock signal input terminal;

a first electrode of the eleventh transistor is connected with the signal output terminal, a second electrode of the eleventh transistor is connected with the low level signal terminal, and a control electrode of the eleventh transistor is connected with the fourth node;

a first terminal of the third capacitor is connected with the second clock signal input terminal, and a second terminal of the third capacitor is connected with the fourth node;

a first terminal of the fourth capacitor is connected with the fourth node, and a second terminal of the fourth capacitor is connected with the signal output terminal.

16. The shift register unit of claim 9, wherein the pull-up module comprises a tenth transistor, a first electrode of the tenth transistor is connected with the high level signal terminal, a second electrode of the tenth transistor is connected with the signal output terminal, and a control electrode of the tenth transistor is connected with the third node.

17. A display apparatus, comprising the shift register of claim 9.

18. The display apparatus of claim 17, wherein the input module comprises a first input unit and a second input unit, the first input unit is connected with the signal input terminal and the first clock signal input terminal, and is configured to control the potential of the first node under the control of the signal inputted from the first clock signal input terminal;

the second input unit is connected with the first node, the first clock signal input terminal and the low level signal terminal, and is configured to control the potential of the second node under the control of the potential of the first node and the signal inputted from the first clock signal input terminal.

19. A method for driving the shift register unit of claim 1, comprising:

in a first period, inputting a low level signal to the signal input terminal, inputting a low level signal to the first clock signal input terminal and inputting a high level signal to the second clock signal input terminal, pulling down potentials of the first node and the second node to be a low level by the input module, pulling up potential of the third node to be a high level by the output control module, pulling down potential of the fourth node to be a low level by the output pull-down module, and outputting a low level signal from the signal output terminal;

in a second period, inputting a high level signal to the signal input terminal, inputting a high level signal to the first clock signal input terminal and inputting a low level signal to the second clock signal input terminal, maintaining potential of the first node to be a low level under the control of the output control module, pulling down potential of the third node to be a low level, pulling up the potential of the second node to be a high level by the input module, outputting a high level signal to the signal output terminal by the pull-up module, maintaining potential of the signal output terminal to be a high level by the output pull-down module;

in a third period, inputting a high level signal to the signal input terminal, inputting a low level signal to the first clock signal input terminal and inputting a high level signal to the second clock signal input terminal, pulling up the potential of the first node to be a high level and pulling down the potential of the second node to be a low level by the input module, and pulling up the potential of the third node to be a high level under the control of the output control module, and controlling the potential of the fourth node to be a high level by the output pull-down module, so that a potential at the signal output terminal is lower than that in the second period since the fourth node discharges;

in a fourth period, inputting a high level signal to the signal input terminal, inputting a high level signal to the first clock signal input terminal and inputting a low level signal to the second clock signal input terminal, maintaining the potential of the first node to be a high level and the potential of the second node to be a low level by the output control module, outputting a high level signal from the third node under the control of the potential of the second node, pulling down the potential of the fourth node to be a low level by the output pull-down module, and outputting a low level signal from the signal output terminal;

in a fifth period, inputting a high level signal to the signal input terminal, inputting a low level signal to the first clock signal input terminal and inputting a high level signal to the second clock signal input terminal, maintaining the potential of the first node to be a high level and the potential of the second node to be a low level by the input module, outputting a high level signal from the third node under the control of the potential of the second node, pulling down the potential of the fourth node to be a low level by the output pull-down module, and outputting a low level signal from the signal output terminal.

20. The method of claim 19, wherein the input module comprises a first input unit and a second input unit; the output control module comprises a first output control unit, a second output control unit and a third output control unit; the output pull-down module comprises a first output pull-down unit and a second output pull-down unit; the method comprises:

in the first period, inputting the low level signal to the signal input terminal, inputting the low level signal to the first clock signal input terminal and inputting the high level signal to the second clock signal input terminal, pulling down the potential of the first node to be a low level by the first input unit, pulling down the potential of the second node to be a low level by the second input unit, pulling up the potential of the third node to be a high level by the second and third output control units, pulling down the potential of the fourth node to be a low level by the second output pull-down unit, and outputting the low level signal from the signal output terminal;

in the second period, inputting the high level signal to the signal input terminal, inputting the high level signal to the first clock signal input terminal and inputting the low level signal to the second clock signal input terminal, maintaining the potential of the first node to be a low level under the control of the first output control unit, pulling up the potential of the second node to be a high level by the second input unit, pulling up the potential of the third node to be a high level by the second output control unit, outputting the high level signal to the signal output terminal by the pull-up module, maintaining the potential of the signal output terminal to be a high level by the first output pull-down unit;

in the third period, inputting the high level signal to the signal input terminal, inputting the low level signal to the first clock signal input terminal and inputting the high level signal to the second clock signal input terminal, pulling up the potential of the first node to be a high level by the first input unit, pulling down the potential of the second node to be a low level by the second input unit, pulling up the potential of the third node to be a high level under the control of the third output control unit, pulling up the potential of the fourth node to be a high level under the control of the first output pull-down unit, so that the potential of the signal output terminal is lower than that in the second period since the fourth node discharges;

in the fourth period, inputting the high level signal to the signal input terminal, inputting the high level signal to the first clock signal input terminal and inputting the low level signal to the second clock signal input terminal, maintaining the potential of the second node to be a low level by the third output control unit, pulling up the potential of the first node to be a high level by the first output control unit, outputting the high level single from the third node under the control of the potential of the second node, pulling down the potential of the fourth node to be a low level by the first output pull-down unit, and outputting the low level signal from the signal output terminal;

in the fifth period, inputting the high level signal at the signal input terminal, inputting the low level signal to the first clock signal input terminal and inputting the high level signal to the second clock signal input terminal, maintaining the potential of the first node to be a high level by the first input unit, maintaining the potential of the second node to be a low level by the second input unit, outputting the high level signal from the third node under the control of the potential of the second node, maintaining potential of the fourth node to be a low level by the second output pull-down unit, and outputting the low level signal from the signal output terminal.

\* \* \* \* \*